(12) United States Patent
Li et al.

(10) Patent No.: US 10,637,440 B2
(45) Date of Patent: *Apr. 28, 2020

(54) LONG-DISTANCE HIGH-SPEED DATA AND CLOCK TRANSMISSION

(71) Applicant: Avago Technologies International Sales PTE. Limited, Singapore (SG)

(72) Inventors: Guansheng Li, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/004,591

(22) Filed: Jun. 11, 2018

(65) Prior Publication Data

US 2018/0294798 A1    Oct. 11, 2018

Related U.S. Application Data

(63) Continuation of application No. 14/638,455, filed on Mar. 4, 2015, now Pat. No. 10,033,351.

(60) Provisional application No. 62/088,912, filed on Dec. 8, 2014.

(51) Int. Cl.
*H03H 11/04* (2006.01)
*H03H 11/46* (2006.01)
*H04L 25/02* (2006.01)

(52) U.S. Cl.
CPC ......... *H03H 11/0405* (2013.01); *H03H 11/53* (2013.01); *H04L 25/0298* (2013.01)

(58) Field of Classification Search
CPC . H01P 1/268; H01P 1/26; H01F 19/00; H01F 19/02; H01F 27/42; H04B 3/16; H04L 25/0298; H03H 11/0405; H03H 11/53

USPC .......... 333/22 R, 214, 216; 323/6, 60, 44 R, 323/356; 324/127, 158 R; 340/410, 340/425.1

See application file for complete search history.

(56) References Cited

U.S. PATENT DOCUMENTS

| | | | |
|---|---|---|---|
| 3,832,575 A | 8/1974 | Dasgupta et al. | |
| 5,027,088 A | 6/1991 | Shimizu et al. | |
| 5,287,022 A | 2/1994 | Wilsher | |
| 7,042,304 B2 | 5/2006 | Radice et al. | |
| 7,394,282 B2 | 7/2008 | Sinha et al. | |
| 10,033,351 B2* | 7/2018 | Li | H03H 11/0405 |
| 2002/0190747 A1* | 12/2002 | Whitworth | H04L 25/0298 |
| | | | 326/30 |

(Continued)

OTHER PUBLICATIONS

Bazarov, "Experiment 3: TTL and CMOS Characteristics", Lecture notes, Cornell University, Department of Physics, Mar. 29, 2010 (Year: 2010).*

(Continued)

*Primary Examiner* — Benny T Lee
*Assistant Examiner* — Hafizur Rahman
(74) *Attorney, Agent, or Firm* — Foley & Lardner LLP

(57) ABSTRACT

A non-linear impedance terminates a transmission line. The non-linear impedance may be implemented with a back-to-back connected inverter pair. The pair acts as a non-linear resistor. A process, voltage, temperature (PVT) tracking circuit may also be provided to improve PVT tracking, with resistance of transistors locked to a calibrated resistor. The replica circuit does not appear in the signal path, and does not add capacitive load.

20 Claims, 8 Drawing Sheets

(56) References Cited

U.S. PATENT DOCUMENTS

2006/0082418 A1    4/2006   Wood
2009/0067614 A1    3/2009   Washburn et al.
2014/0035615 A1    2/2014   Binder

OTHER PUBLICATIONS

Bursky, Dave, "Shhh! Nonlinear Active Termination Quiets Ringing," Electronic Design Magazine, No. 20, 2011, pp. 1-5, 6 total pages.

* cited by examiner

US 10,637,440 B2

LONG-DISTANCE HIGH-SPEED DATA AND CLOCK TRANSMISSION

CROSS-REFERENCE TO RELATED PATENT APPLICATIONS

This application is a continuation of U.S. application Ser. No. 14/638,455, filed Mar. 4, 2015, which claims the benefit of and priory to U.S. Provisional Application No. 62/088,912, filed Dec. 8, 2014, both of which are hereby incorporated by reference herein in their entireties.

TECHNICAL FIELD

This disclosure relates to signal transmission. This disclosure also relates to long-distance, high-speed data and clock transmission.

BACKGROUND

Rapid advances in electronics and communication technologies, driven by immense customer demand, have resulted in the widespread adoption of a wide array of sophisticated electronic devices. These devices often rely on high speed processing circuitry that implements complex functionality. In many cases, the circuitry employs high speed signaling over long distances. Improvements in the communication pathways for such signaling will improve the performance and functionality of these devices.

DETAILED DESCRIPTION

Figure 1:
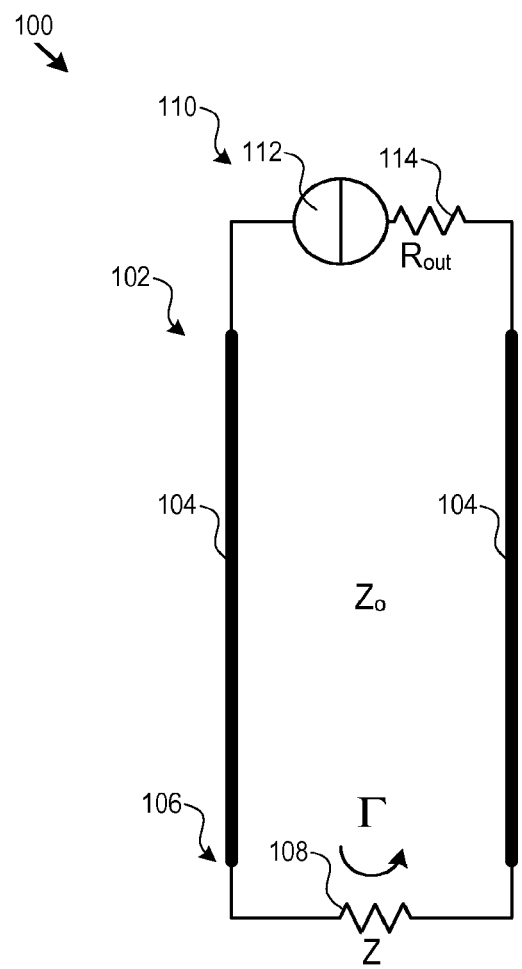
FIG. 1 shows an example transmission line with a non-linear impedance for far end termination.

FIG. 1 shows an example transmission line 100 with a non-linear impedance for far end termination. More particularly, the transmission line 100 includes a signal path 102 that provides a signal propagation medium 104 along which signals travel. At the end of the signal path 102 is a termination point 106. A non-linear impedance 108, Z, is connected at the termination point.

For the purposes of explanation below, FIG. 1 also shows a driver circuit 110. The driver circuit 110 drives signals onto the transmission line 100. In FIG. 1, the driver circuit 110 is modeled as a voltage source 112 in series with an impedance 114, $R_{out}$. Note that $R_{out}$ is often difficult to control accurately, and nonlinear termination will facilitate better performance for the transmission line 100.

The signal path 102 may be differential, as shown, or single ended. The signal path is characterized by an impedance, $Z_0$. Signal reflections at the termination point 106 may occur when $Z_0$ is not equal to Z. A measure of the mismatch between $Z_0$ and Z is the reflection coefficient parameter, denoted by gamma:

$$\Gamma = \frac{Z - Z_0}{Z + Z_0}$$

The signal propagation medium 104 may be any electrical conductor. As examples, the signal propagation medium 104 may be metal or polysilicon lines within an integrated circuit, traces between modules carried in a Multiple-Chip-Module (MGM), traces on a circuit board that carry signals between sets of circuitry on the circuit board, wire cables such as coaxial cables, or other propagation mediums. In some cases, the non-linear impedance 108 may be included when the wavelength of the signals on the signal path 102 is comparable to the length of the signal path 102. Said another way, the wavelength of a signal is the propagation speed (e.g., the speed of light) divided by the signal frequency. When the physical length of a signal path becomes comparable to wavelength (e.g., more than one tenth of a wavelength), then non-linear termination may be included to help prevent undesired signal reflections. The non-linear impedance 108 may be included when it is desired to manage signal reflections that are expected to be significant arising from an impedance mismatched termination point 106. In some systems, the length may be on the order of several millimeters, although there is no restriction on when the non-linear impedance 108 may be included.

The termination point 106 may represent any endpoint for the signal path 102 or selected location along the signal path 102. As an example, the termination point may be at or adjacent to the input of a processing circuit that processes signals sent by the driver circuit 110.

Figure 2:
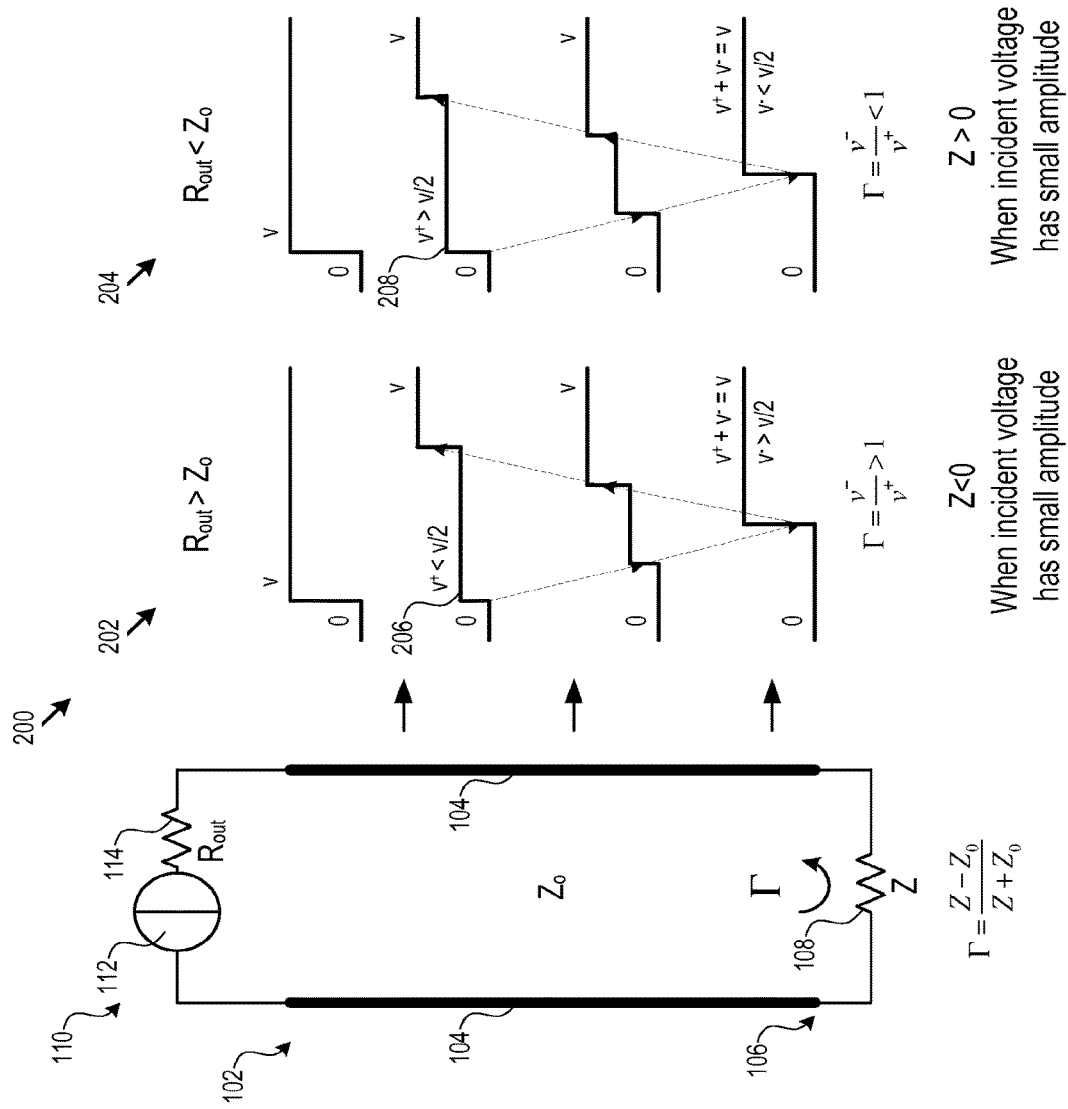
FIG. 2 shows examples of signal response in the transmission line.

FIG. 2 shows examples of signal response 200 in the transmission line 100. In FIG. 2, v+ represents the pulse travelling in the positive direction down the signal path 102 toward the termination point 106, and v− represents the reflected pulse, with the total voltage, v=v++v−. In example 202, $R_{out} > Z_0$, while in example 204, Rout<$Z_0$.

For the example 202, $R_{out} > Z_0$ causes a voltage step 206 that is less than half of the voltage swing. The voltage at the far end should settle to the full voltage swing, v. A v− larger than v+ is therefore desired to reach the full voltage swing, v. This, in turn, means:

$\Gamma > 1$ $z < 0|$

That is, for the example 202, the non-linear impedance 108 presents a negative impedance.

For the example 204, $R_{out} < Z_0$ causes a voltage step 208 that is greater than half of the voltage swing. The voltage at the far end should settle to the full voltage swing, v. A v− smaller than v+ is therefore desired to reach the full voltage swing, v. This, in turn, means:

$\Gamma < 1$ $z > 0$

That is, for the example 202, the non-linear impedance 108 presents a positive impedance. Expressed another way, the non-linear impedance 108 is a voltage dependent impedance.

Figure 3:
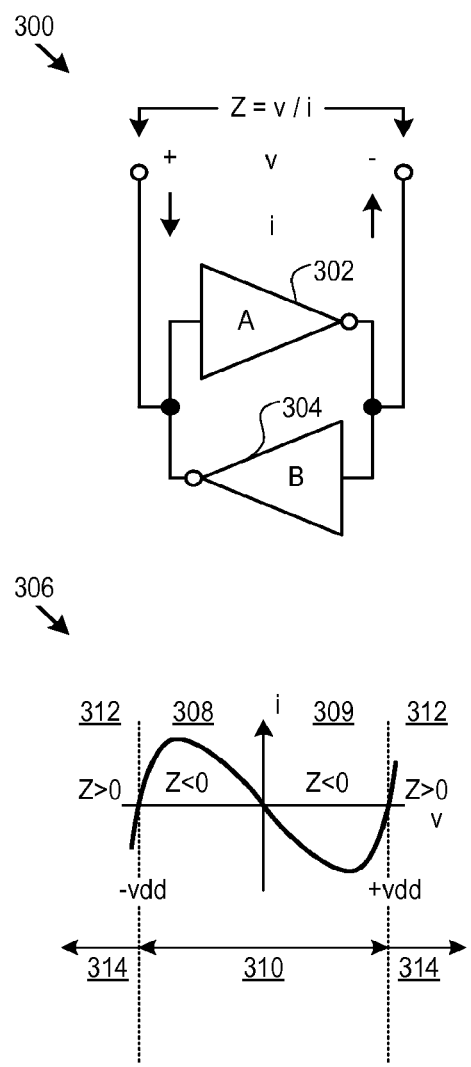
FIG. 3 is an example of a non-linear impedance.

FIG. 3 shows an example implementation 300 for the non-linear impedance 108. In this example, the non-linear impedance includes a first inverter 302 connected back-to-back with a second inverter 304. The first inverter 302 and second inverter 304 are not used as digital switches, but in an analog manner as voltage controlled resistors. FIG. 3 shows the voltage and current conventions used for the discussion of the impedance of this configuration, in connection with the voltage and current waveform 306.

Note that the non-linear impedance presents a negative impedance in regions 308 and 309 (i.e., v/i<0) in response to a first range of input voltage 310, e.g., |v|<| vdd | where vdd is the power supply voltage to the transistors in the first and second inverters 302 and 304. In region 309, for instance, v is positive, and the first inverter 302 tries to drive its output low, thereby sinking current (and i is negative given the current convention), while in region 308, v is negative and the inverter 304 tries to drive its output low, thereby sinking current (and i is positive given the current convention).

The non-linear impedance presents a positive impedance 312 (i.e., v/i>0) in response to a second range of input voltage 314 that is different than the first range of input voltage 310, e.g., |v|>| vdd |. As shown in FIG. 3, the non-linear impedance is a voltage dependent impedance, with current changing depending on the applied voltage.

Figure 4:
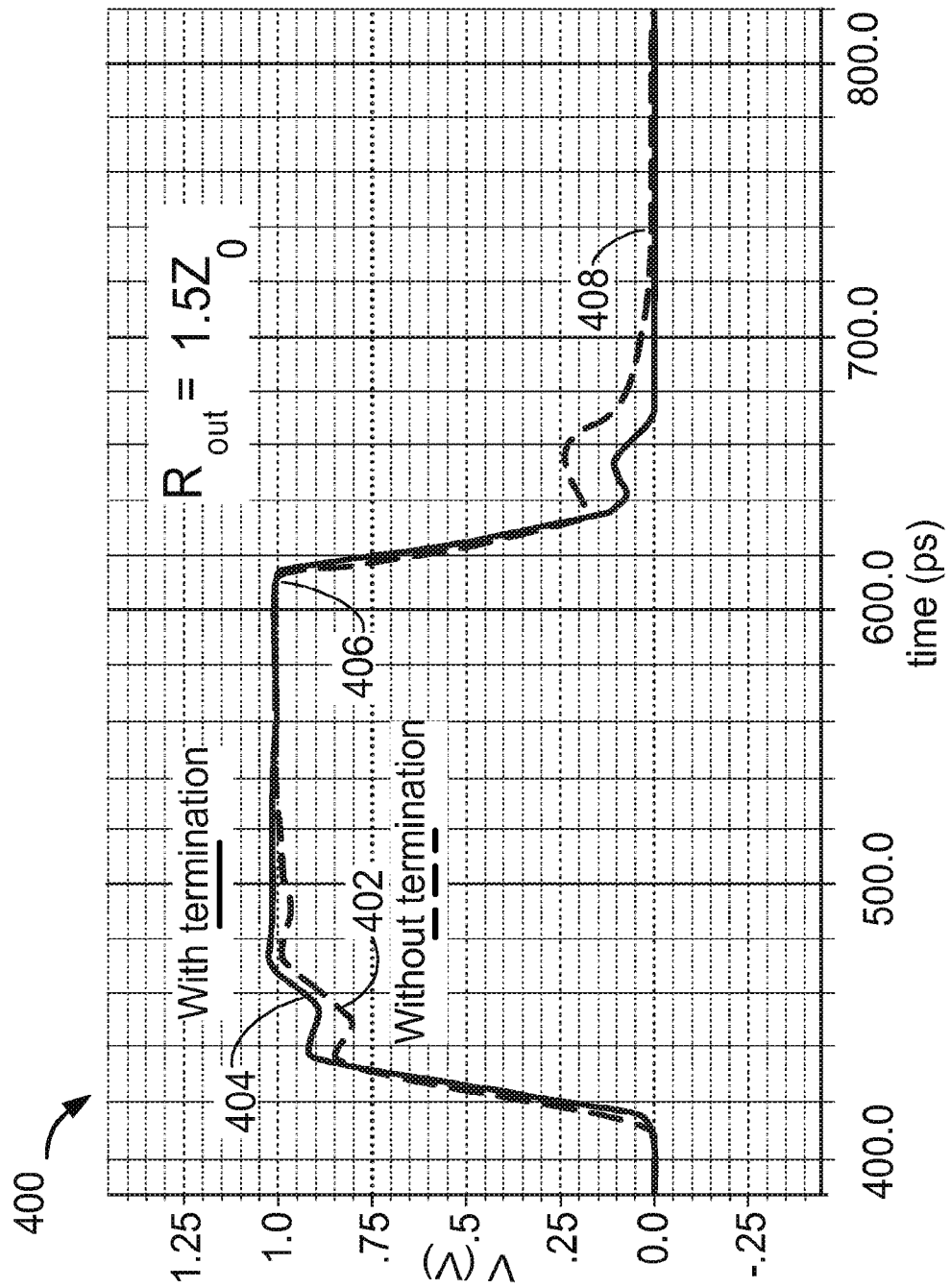
FIG. 4 shows an example of undershoot performance for the transmission line.

FIG. 4 shows an example of undershoot performance 400 for the transmission line. The voltage curve 402 shows performance without termination of the signal path 102. The voltage curve 404 shows performance with termination of the signal path 102 by the non-linear impedance shown in FIG. 3. Note that with termination, the voltage curve rises much more quickly to the desired high voltage 406, and also falls more quickly to the desired low voltage 408.

Figure 5:
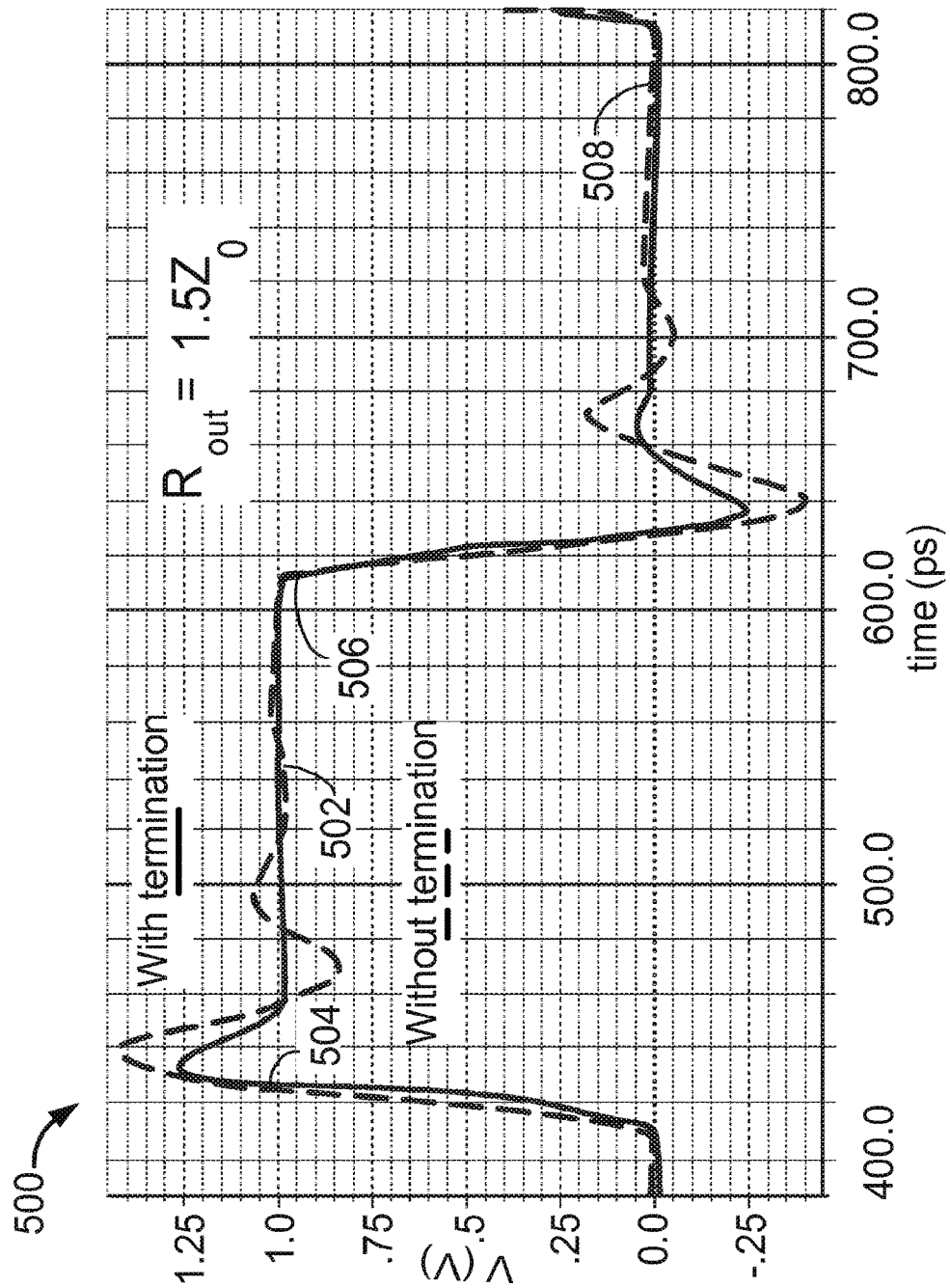
FIG. 5 shows an example of overshoot performance for the transmission line.

FIG. 5 shows an example of overshoot performance 500 for the transmission line. The dashed voltage curve 502 shows performance without termination of the signal path 102. The solid voltage curve 504 shows performance with termination of the signal path 102 by the non-linear impedance shown in FIG. 3. Note that with termination, the voltage curve 504 has less overshoot, and settles to the final high voltage 506 and the final low voltage 508 more quickly than without termination.

Figure 6:
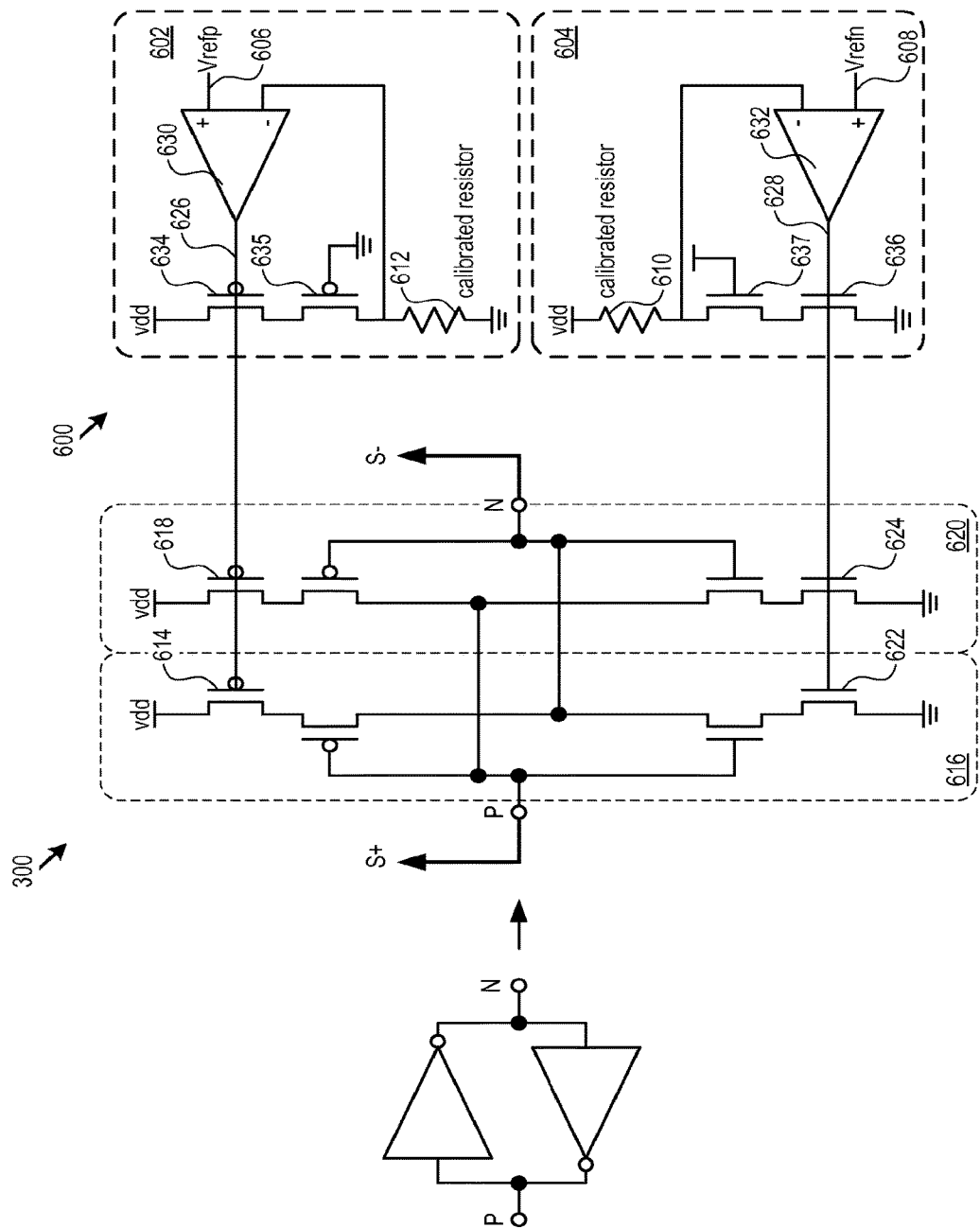
FIG. 6 shows an example implementation of a non-linear resistor with biasing circuitry.

FIG. 6 shows an example implementation of a non-linear resistor with biasing circuitry 600. There is a positive-side bias circuit 602 and a negative-side bias circuit 604. Each bias circuit includes a reference voltage input, e.g., the positive-side reference voltage Vrefp 606 and the negative side reference voltage Vrefn 608. The reference voltages may be set to one-half of vdd, for instance, with the individual transistor matched in width | length or wide | length ratio. Each bias circuit also includes a calibrated output impedance, e.g., the positive-side calibrated impedance 610 and the negative-side calibrated impedance 612, connected to the non-linear impedance.

The positive-side bias circuit 602 is connected to a positive side transistor 614 in the first inverter 616 and to a positive side transistor 618 in the second inverter 620. The first inverter 616 is connected back-to-back with the second inverter 620. The negative-side bias circuit 604 is connected to a negative-side transistor 622 in the first inverter 616 and to a negative-side transistor 624 in the second inverter 620.

As noted above, the signal path 102 may be a differential signal path. The non-linear impedance 108 may then be connected across the differential signal path. More specifically, with reference to the example in FIG. 6, the non-linear impedance 300 is connected across the differential signal path S+ and S−, which may be a differential clock line, data line, control line, or any other type of communication path. FIG. 6 shows the first input, P, of the inverter 616 connected to the first path S+ and the second input, N, of the inverter 620 connected to the second path S−.

The reference voltage 606 is mirrored at the negative-side calibrated impedance 612, causing a known fixed current to flow through the negative-side calibrated impedance 612. The reference voltage 608 is mirrored at the positive-side calibrated impedance 610, causing a known fixed current to flow through the positive-side calibrated impedance 610. The outputs 626, 628 of the operational amplifiers 630, 632 adjust to control their respective current source transistors 634, 636 (which are matched to the inverter transistors), and thereby account for any process, voltage, or temperature (PVT) variation, in the process of generating the known fixed currents. The transistor 634 is part of a stacked pair of transistors 634, 635, and the transistor 636 is part of the stacked pair of transistors 636, 637. In the positive side bias circuit 602, the current through the stacked transistors 634, 635 is fixed to Vrefp divided by the negative-side calibrated impedance 612, and the voltage across the stacked transistors 635, 635 is fixed to vdd−Vrefp. Accordingly, the effective impedance of the stacked transistors 634, 635 is fixed and has no PVT variation; a characteristic copied to the first inverter 616 and the second inverter 620.

Figure 7:
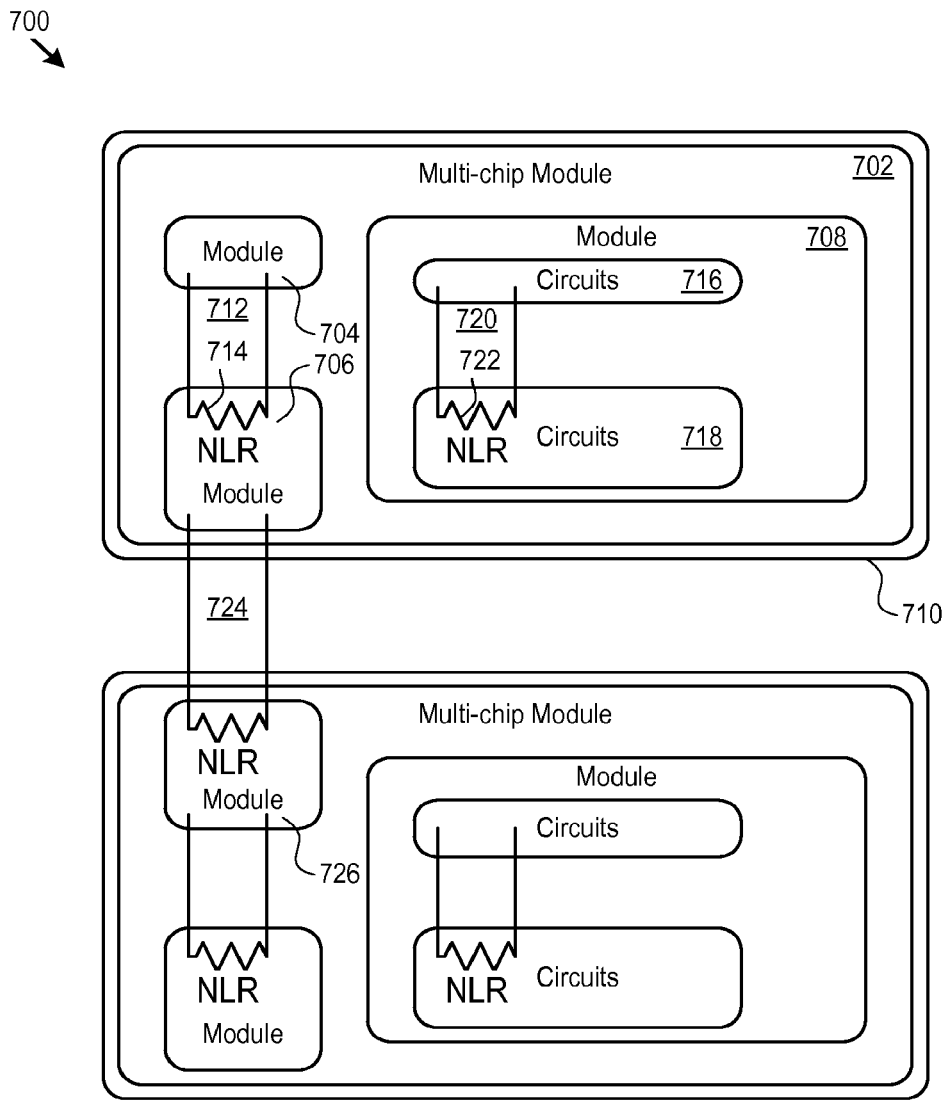
FIG. 7 shows connections between circuits, the connections terminated by non-linear impedances.

FIG. 7 shows connections between modules 700, the connections terminated by non-linear impedances. In the example in FIG. 7, a multi-chip module (MGM) 702 includes individual modules 704, 706, and 708. The MGM 702 may be provided, for instance, on a single common carrier 710.

The module 704 communicates with the module 706 over an inter-module signal path 712. The signal path is terminated with a non-linear resistor (NLR) 714. The NLR 714 may be the back-to-back inverter configuration discussed above. As another example, the module 708 includes circuitry 716 and 718 that communicate over an inter-circuitry signal path 720. The inter-circuitry signal path 720 is terminated with a NLR 722. The NLR 722 may be the back-to-back inverter configuration discussed above. As a further example, the NLR-terminated inter-MCM signal path 724 connects the module 706 and the module 726. As additional examples, NLRs may terminate signal paths between circuit boards or discrete systems.

Figure 8:
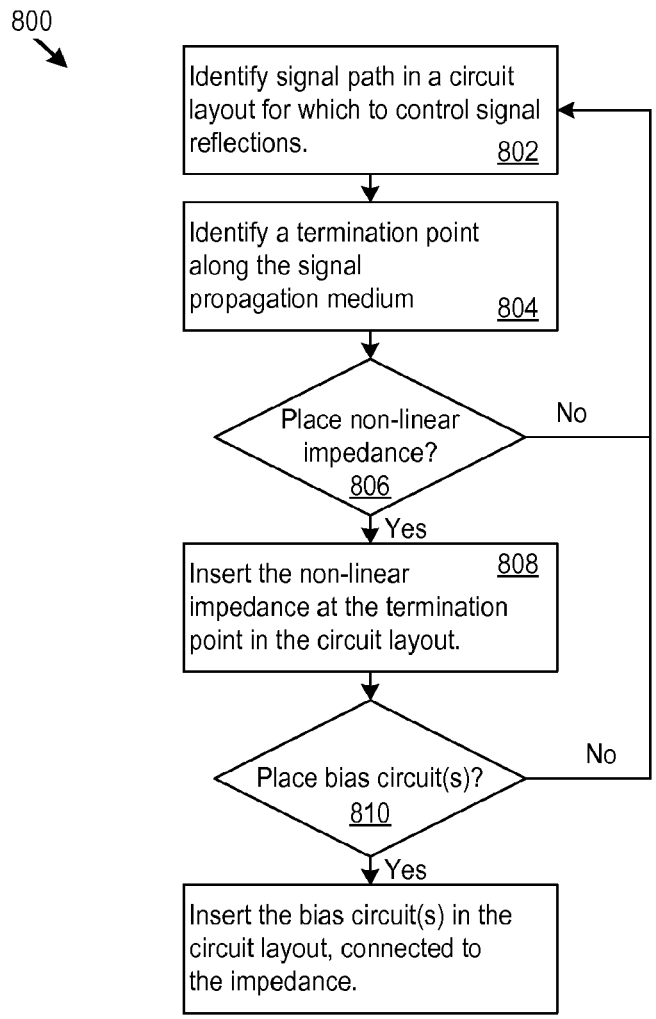
FIG. 8 shows a circuit design process.

FIG. 8 shows a circuit design process 800. The process 800 may be implemented in a circuit design tool (e.g., in software) stored in a memory and executed by a processor in a circuit design hardware system, for instance. The process 800 includes identifying a signal path in a circuit layout for which to control signal quality (e.g., to reduce reflections) (802). The signal path includes a signal propagation medium along which signals travel. The process 800 also identifies a termination point along the signal propagation medium (804), e.g., at the end of the signal propagation medium.

The process 800 determines whether to place a non-linear impedance at the termination point (806). For instance, the process 800 may determine whether sufficient layout space exists to place the impedance, whether impedance mismatch at the termination point is calculated to exceed a placement threshold, or may make the determination based on other criteria. If the impedance will be placed, then the process 800 places the impedance in the circuit layout (808). As noted above, the impedance may present a negative impedance in response to a first range of input voltage and present a positive impedance in response to a second range of input voltage that is different than the first range of input voltage. The impedance may be a first inverter connected back-to-back with a second inverter.

Further, the process 800 may determine whether to place bias circuit(s) in the layout (810), such as bias circuits 602 and 604. The bias circuits may include a reference voltage input and a calibrated output impedance connected to the nonlinear impedance. More particularly, the bias circuits may include a positive-side bias circuit comprising a positive-side reference voltage input and a positive-side calibrated output impedance connected to the non-linear impedance, as well as a negative-side bias circuit comprising a negative-side reference voltage input and a negative-side calibrated output impedance connected to the non-linear impedance.

The circuit design hardware system may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLO), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MGM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HOD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:

1. A transmission line comprising:
a signal path comprising:
a signal propagation medium; and
a termination point along the signal propagation medium; and
an impedance connected at the termination point along the signal path, wherein the impedance comprises a first inverter and a second inverter, wherein a gate electrode of a positive side transistor in the first inverter is connected to a gate electrode of a positive side transistor in the second inverter, and a gate electrode of a negative side transistor in the first inverter is connected to a gate electrode of a negative side transistor in the second inverter.

2. The transmission line of claim 1, where:
the impedance exhibits properties of a non-linear resistor.

3. The transmission line of claim 1, where:
the impedance is voltage controlled.

4. The transmission line of claim 1, where:
the signal path comprises a differential signal path.

5. The transmission line of claim 4, where:
the impedance is connected across the differential signal path.

6. The transmission line of claim 4, where:
the differential signal path comprises a first path and a second path;
an input voltage of the impedance comprises a differential voltage comprising a positive component and a negative component; and
the impedance comprises:
the first inverter with a first input configured to receive the positive component of the differential voltage; and
the second inverter with a second input configured to receive the negative component of the differential voltage; where:
the first inverter is connected back-to-back with the second inverter;
the first input is connected to the first path; and
the second input is connected to the second path.

7. A transmission line comprising:
a signal path comprising:
a signal propagation medium; and
a termination point along the signal propagation medium; and
an impedance connected at the termination point along the signal path, wherein the impedance comprises a first inverter and a second inverter, wherein a positive side transistor in the first inverter is connected to a positive side transistor in the second inverter, and a negative side transistor in the first inverter is connected to a negative side transistor in the second inverter; and
a bias circuit comprising:
a reference voltage input configured to be one-half of a supply voltage; and
a calibrated output impedance of the bias circuit connected to the impedance for the bias circuit to configure the impedance according to the reference voltage input.

8. The transmission line of claim 7, where:
the reference voltage input comprises a positive side reference voltage;
the calibrated output impedance comprises a positive side calibrated output impedance and a negative side calibrated output impedance; and
the bias circuit is connected to the positive side transistor in the first inverter.

9. The transmission line of claim 8, where:
the reference voltage input comprises a negative side reference voltage;

wherein the bias circuit is further connected to the negative side transistor in the first inverter.

10. A method comprising:
providing a signal path in a circuit, the signal path comprising a signal propagation medium; and
in the circuit, providing an impedance at a termination point along the signal path by placing a first inverter connected back-to-back with a second inverter, wherein a positive side transistor in the first inverter is connected to a positive side transistor in the second inverter, and
a negative side transistor in the first inverter is connected to a negative side transistor in the second inverter, wherein providing the impedance includes:
providing a negative impedance in response to a first range of input voltages, and providing a positive impedance in response to a second range of input voltages.

11. The method of claim 10, wherein providing the impedance comprises providing a non-linear resistor.

12. The method of claim 11, wherein the non-linear resistor is a voltage controlled resistor.

13. The method of claim 10, further comprising:
providing a bias circuit comprising a reference voltage input and a calibrated output impedance connected to the impedance.

14. The method of claim 10, further comprising:
providing a positive side bias circuit comprising a positive side reference voltage input and a positive side calibrated output impedance connected to the impedance; and
providing a negative side bias circuit comprising a negative side reference voltage input and a negative side calibrated output impedance connected to the impedance.

15. A circuit comprising:
a first circuit;
a second circuit;
a differential signal line connecting the first circuit and the second circuit; and
an impedance connected across the differential signal line, wherein the impedance comprises a first inverter and a second inverter, wherein a gate electrode of a positive side transistor in the first inverter is connected to a gate electrode of a positive side transistor in the second inverter, and a gate electrode of a negative side transistor in the first inverter is connected to a gate electrode of a negative side transistor in the second inverter.

16. The circuit of claim 15, where:
the first circuit and the second circuit are carried in a multiple-chip module package; and
the first inverter is connected back-to-back with the second inverter.

17. The circuit of claim 15, where the impedance exhibits properties of a non-linear resistor.

18. The circuit of claim 17, wherein the non-linear resistor is voltage controlled.

19. The circuit of claim 15, further comprising:
a bias circuit comprising:
a reference voltage input; and
a calibrated output impedance connected to the impedance.

20. A circuit comprising:
a first circuit;
a second circuit;
a differential signal line connecting the first circuit and the second circuit; and
an impedance connected across the differential signal line, wherein the impedance comprises a first inverter and a second inverter, wherein a positive side transistor in the first inverter is connected to a positive side transistor in the second inverter, and a negative side transistor in the first inverter is connected to a negative side transistor in the second inverter,
wherein the impedance is configured to:
present a negative impedance in response to a first range of input voltages, wherein the first range of input voltages is below a power supply input voltage applied to the impedance; and
present a positive impedance in response to a second range of input voltages,
wherein the second range of input voltages is above the power supply input voltage.

* * * * *